(12) United States Patent
Chiachanavong et al.

(10) Patent No.: US 8,423,870 B1
(45) Date of Patent: Apr. 16, 2013

(54) METHOD AND APPARATUS FOR DETERMINING THE START OF A DATA FIELD IN A DATA FRAME

(75) Inventors: Panu Chiachanavong, Mountain View, CA (US); Heng Tang, Sunnyvale, CA (US); Zaihe Yu, Santa Clara, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1058 days.

(21) Appl. No.: 12/402,438

(22) Filed: Mar. 11, 2009

Related U.S. Application Data (60) Provisional application No. 61/038,905, filed on Mar. 24, 2008.

(51) Int. Cl.
*H03M 13/00* (2006.01)

(52) U.S. Cl.
USPC ............................................ 714/776; 714/798

(58) Field of Classification Search .................. None
See application file for complete search history.

(56) References Cited

U.S. PATENT DOCUMENTS

| | | | | |
|---|---|---|---|---|
| 4,853,915 A * | 8/1989 | Takasago et al. | ............. | 369/30.1 |
| 5,182,752 A * | 1/1993 | DeRoo et al. | ................ | 714/758 |
| 5,838,730 A * | 11/1998 | Cripps | ........................ | 375/272 |
| 5,862,470 A * | 1/1999 | Damghani | .................... | 455/418 |
| 5,909,331 A * | 6/1999 | Behrens et al. | ................ | 360/51 |
| 6,249,896 B1 * | 6/2001 | Ho et al. | ........................ | 714/814 |
| 6,473,875 B1 * | 10/2002 | Anderson | ....................... | 714/746 |
| 6,557,113 B1 * | 4/2003 | Wallentine et al. | ............ | 714/5.1 |
| 7,774,685 B2 * | 8/2010 | Wilson et al. | .................. | 714/768 |
| 2005/0264907 A1 * | 12/2005 | Dati et al. | ......................... | 360/48 |
| 2007/0297079 A1 * | 12/2007 | Motwani | .......................... | 360/51 |
| 2009/0077447 A1 * | 3/2009 | Buckley et al. | ................. | 714/757 |

OTHER PUBLICATIONS

IEEE Standard 802.3, Telecommunications and information exchange between systems—Local and metropolitan area networks—Specific requirements Part 3: Carrier sense multiple access with Collision Detection (CSMA/CD) Access Method and Physical Layer Specifications, Dec. 26, 2008, 671 pages.

IEEE Standard 802.3, Telecommunications and information exchange between systems—Local and metropolitan area networks—Specific requirements Part 3: Carrier sense multiple access with Collision Detection (CSMA/CD) Access Method and Physical Layer Specifications, Section Two, Jun. 22, 2010, 790 pages.

IEEE Standard 802.3, Telecommunications and information exchange between systems—Local and metropolitan area networks—Specific requirements Part 3: Carrier sense multiple access with Collision Detection (CSMA/CD) Access Method and Physical Layer Specifications, Section Three, Jun. 22, 2010, 315 pages.

(Continued)

*Primary Examiner* — Gabriel Chu (57) ABSTRACT

A method for generating a data frame for data transmission includes using a processor to generate a first padding field. The method also includes using the processor to generate one or more parity bits by encoding an input comprising the first padding field, a syncmark and data to be transmitted. The method also includes using the processor to add the one or more parity bits to the data frame. The method also includes using the processor to add a second padding field after the one or more parity bits.

10 Claims, 11 Drawing Sheets

OTHER PUBLICATIONS

IEEE Standard 802.3, Telecommunications and information exchange between systems—Local and metropolitan area networks—Specific requirements Part 3: Carrier sense multiple access with Collision Detection (CSMA/CD) Access Method and Physical Layer Specifications, Section Four, Jun. 22, 2010, 315 pages.

IEEE Standard 802.3, Telecommunications and information exchange between systems—Local and metropolitan area networks—Specific requirements Part 3: Carrier sense multiple access with Collision Detection (CSMA/CD) Access Method and Physical Layer Specifications, Section Five, Jun. 22, 2010, 315 pages.

* cited by examiner

METHOD AND APPARATUS FOR DETERMINING THE START OF A DATA FIELD IN A DATA FRAME

CROSS REFERENCE TO RELATED APPLICATION

This application claims the benefit of priority to previously filed U.S. provisional patent application Ser. No. 61/038,905, filed Mar. 24, 2008, entitled CODE FOR SYNCHRONIZATION AND RANDOM ERROR CORRECTION. That provisional application is hereby incorporated by reference in its entirety.

BACKGROUND

1. Field of the Invention

The present invention relates generally to data transmission, and more particularly to detecting a data start location in data transmission.

2. Description of Related Art

Figure 1:
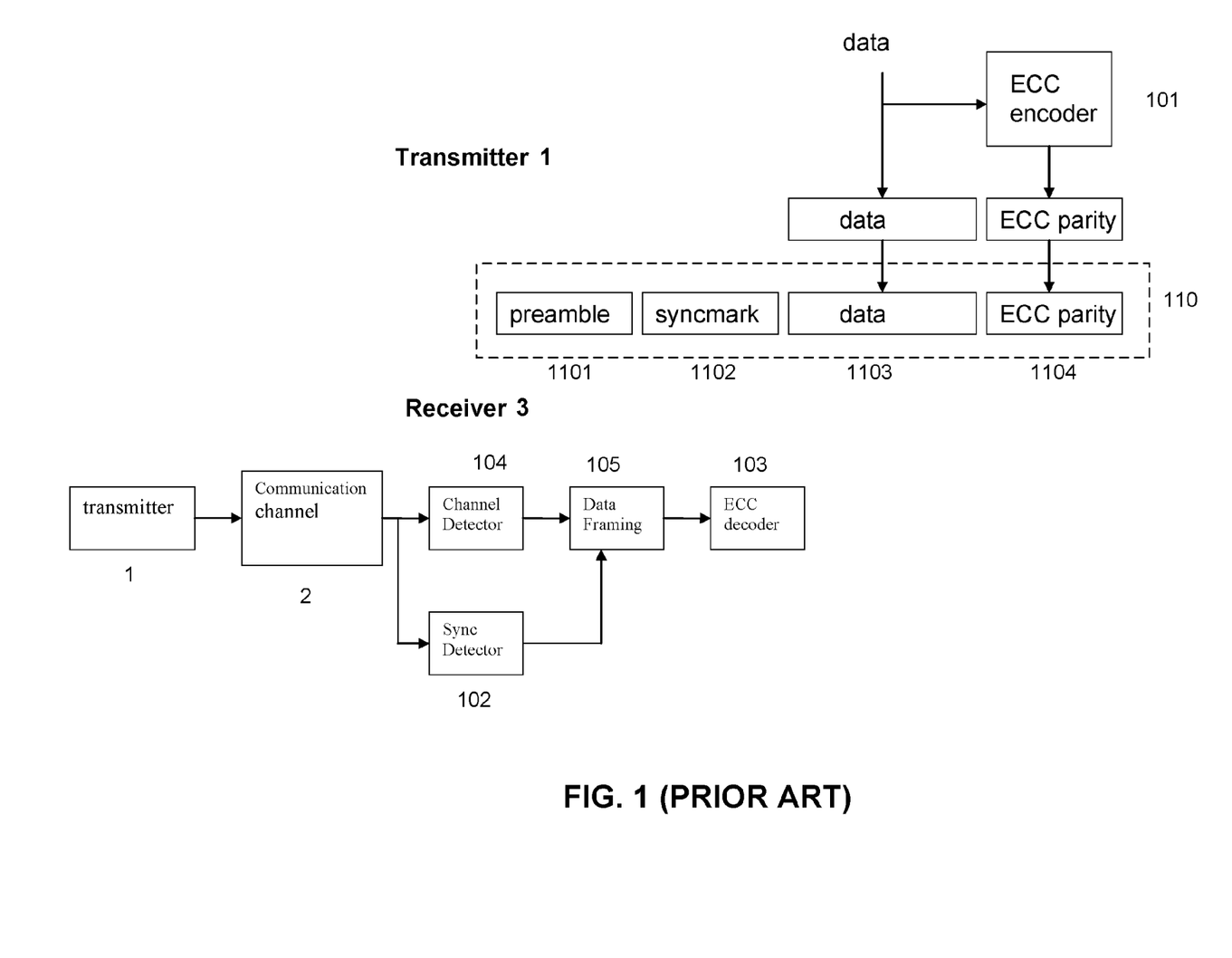
FIG. 1 illustrates a prior art data frame structure and a process of data transmission.

FIG. 1 illustrates a prior art data frame structure and a data transmission process. At a transmitter 1, a data frame 110 may start with a preamble field 1101, which is followed in sequence by a syncmark field 1102, a data field 1103 (also referred to as payload), and an ECC parity field 1104. The syncmark may be a unique series of 0 and 1 and may be used to identify, preferably with high reliability, the start of data to be transmitted. Since the data field is immediately after the syncmark, as long as the syncmark is detected, the start of data will be located. An error correcting code (ECC) may be used to protect the data by detecting whether there is a transmission error.

Figure 2A:
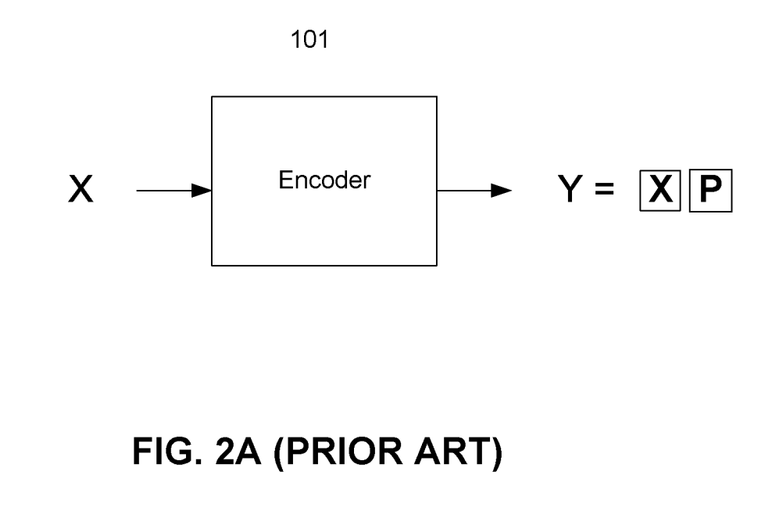
FIG. 2A briefly illustrates a prior art encoding process.

In the transmitter 1, an ECC encoder 101 may be non-systematic. For example, the ECC encoder 101 may multiply an original message vector, which may include the data field and one or more other fields in the data frame, with a generator polynomial to generate a codeword. The ECC encoder 101 may be a systematic encoder which receives an original message X and generates a codeword Y including the original message X and parity bits P, as shown in FIG. 2A.

Looking back at FIG. 1, in a receiver 3, the codeword received from the transmitter 1 via a communication channel 2 may first enter a syncmark detector 102, which may search for the syncmark and detect the data start location. An ECC decoder 103, which receives the codeword via a channel detector 104 and a data framing block 105, may then check whether there is a transmission error. If either the syncmark search or ECC decoding fails, the receiver may fail to recover the data.

Figure 2B:
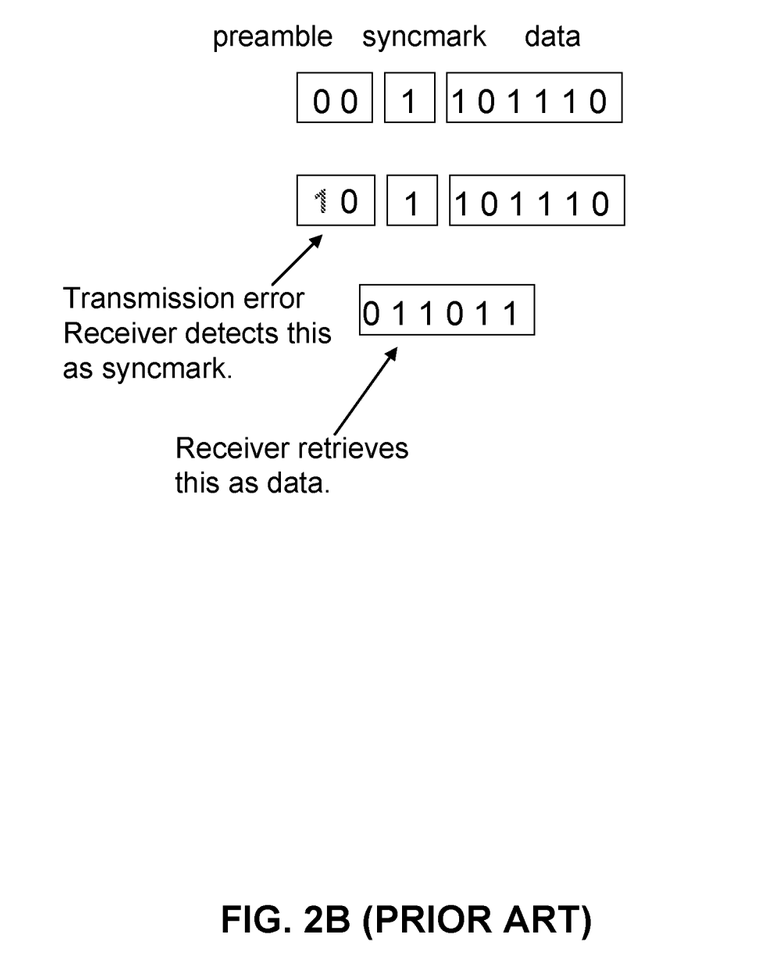
FIG. 2B illustrates a failed search for data start location in a prior art data transmission system.

FIG. 2B illustrates a failed search for data start location in a prior art data transmission system. As shown, a transmitted data frame may be "00 1 101110", wherein the preamble is "00", the syncmark is "1", and the data to be transmitted is "101110". At the receiver side, the syncmark detector 102 may search for the syncmark "1" and the six bits after the syncmark will be retrieved as the data. If a transmission error occurs, and the preamble in the received data frame changes to "10" from "00", the data frame received may be "10 1 101110". The syncmark detector 102 may detect the first "1" in the data frame as the syncmark, and retrieve the six bits "011011" following it as the transmitted data, instead of "101110" which is intended to be transmitted from the transmitter. The syncmark detector thus would confuse the "1" with other data in the frame. The wrong data may then enter the ECC decoder 103, which is not able to correct this type of mistake.

One known solution to this problem is to use a syncmark which is sufficiently long. However, a long syncmark may reduce data format efficiency because of increase in overhead in a data frame, for example. Therefore, it may be desirable to provide a method and apparatus which may improve reliability in detecting data start location without costing data format efficiency.

SUMMARY

A method for generating a data frame for data transmission comprises: generating a first padding field; generating one or more parity bits by encoding an input comprising the first padding field, a syncmark and data to be transmitted; and adding the one or more parity bits to the data frame. The parity may be generated with a Hamming code. Alternatively, the parity may be generated using a cyclic ECC.

A method for detecting a syncmark in data transmission comprises: receiving a data frame which includes the syncmark; decoding the data frame to detect if the data frame has a transmission error; correcting the transmission error if detected; and identifying the syncmark after the decoding. The decoding and correcting may use a Hamming code. The data frame may be encoded with a cyclic ECC.

An apparatus for generating a data frame for data transmission comprises: a padding field generator for generating a first padding field; and an encoder, for generating one or more parity bits by encoding an input comprising the first padding field, a syncmark and data to be transmitted and adding the one or more parity bits to the data frame. The encoder may use a Hamming code, or may be a cyclic ECC.

An apparatus for detecting a syncmark in data transmission comprises: a decoder for decoding a data frame including the syncmark, detecting if the data frame has a transmission error, and correcting the transmission error if detected; and a detector for detecting the syncmark in a decoded data frame from the decoder. The decoder may use a Hamming code. The data frame may be encoded with a cyclic ECC.

BRIEF DESCRIPTION OF THE DRAWING FIGURES

Embodiments of the present invention are described herein with reference to the accompanying drawings, similar reference numbers being used to indicate functionally similar elements.

DETAILED DESCRIPTION

In some communication channels, the framing information on a transmitted packet is known up to some small uncertainty M, M=0, 1, 2, . . . . In this case, the traditional approach of obtaining a more reliable communication system, which improves a syncmark detector by designing a stronger (i.e. longer) syncmark pattern and at the same time uses a stronger ECC, might not be optimal.

Figure 3:
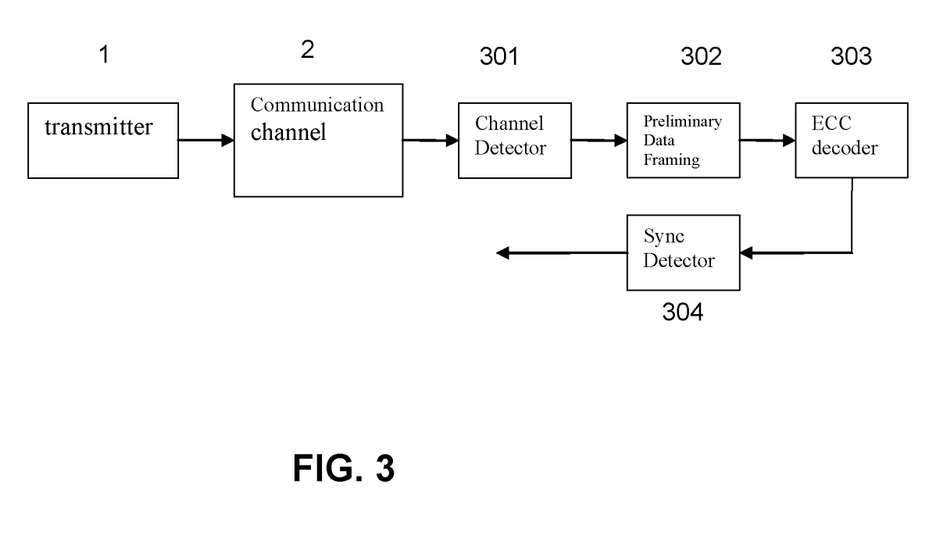
FIG. 3 illustrates a process of data transmission according to one embodiment of the present invention.

As shown in FIG. 3, in a receiver according to one embodiment of the present invention, a preliminary data framing block 302, which may receive a codeword from the transmitter 1 via the communication channel 2 and a channel detector 301, may provide initial data framing based on the system's internal framing information without using syncmark detection. The preliminary framing may be done in such a way as to achieve the alignment where the first bit of a frame corresponds to the first bit of its syncmark, or one of the bits immediately preceding the syncmark. An ECC encoder in the transmitter 1 may be designed to make sure that the code does not see any errors due to potential ambiguity in data framing following the preliminary data framing block 302. An ECC decoder 303 may then proceed to correct random errors that might occur during data transmission. Once all the errors are fixed, a syncmark detector 304 may be run to achieve data synchronization. The invention may be carried out on a computer with computer-executable instructions. Advantages of the present invention will become apparent from the following detailed description.

Figure 4A:
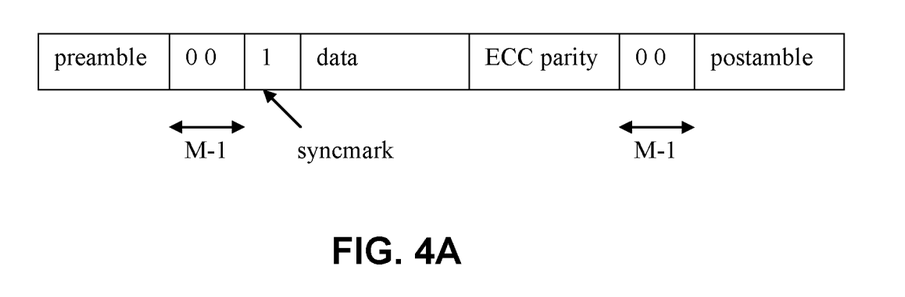
FIGS. 4A-4E illustrate data frame structures according to embodiments of the present invention.

FIG. 4A illustrates a data frame structure according to one embodiment of the present invention. A data frame may start with a preamble field, which may be followed in sequence by a preceding padding field, syncmark field, a data field, an ECC parity field and a tailing padding field. The tailing padding field may be followed by a postamble field.

Since the syncmark does not have to tolerate any error in the inventive scheme, a one bit syncmark may be enough, although more bits may be used. To make the syncmark search more accurate, the syncmark may be selected to be easy to distinguish from the pad bits. In the embodiment shown, the pad bits are two 0s, and the syncmark is 1. Alternatively, the pad bits may be all 1s, and the syncmark may be 0.

The uncertainty M of the data start location in a communication channel may be the possible numbers of the data start location and may be obtained by experiments. At the transmitter 1, M−1 0s may be padded before the syncmark as the preceding padding field. In the embodiment shown in FIG. 4A, M=3, and the preceding padding field may have two 0s. It should be understood that the padding fields may have more or fewer bits, and the syncmark may have more bits.

In one embodiment, instead of adding pad bits into a data frame, bits in the preamble may be used as bits in the preceding padding field and bits in the postamble may be used as bits in the tailing padding field.

Figure 4B:
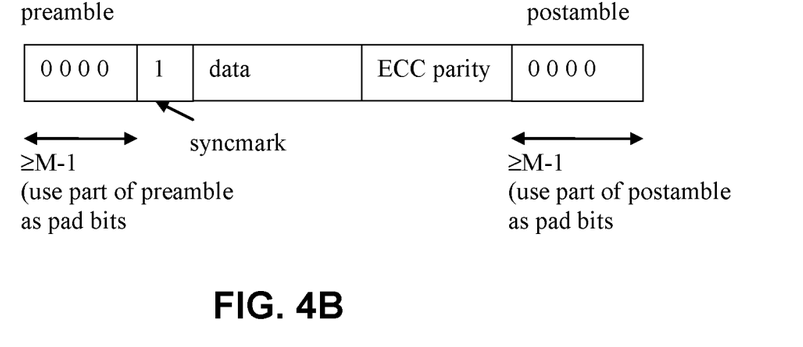

FIG. 4B illustrates a data frame structure according to one embodiment of the present invention. Assuming M=3 and the syncmark field has one bit, when the preamble is all-zeros and longer than or equal to M−1 bits, the syncmark may be chosen as 1. The last M−1 bits of the preamble may be used as the preceding padding field, and no more padding before syncmark is necessary. Similarly, when the postamble is all-zeros and longer than or equal to M−1 bits, the first M−1 bits may be used as the tailing padding field, and no more padding after the ECC parity is necessary. As shown in FIG. 4B, the last two 0s in the preamble may be used as the preceding padding field and the first two 0s in the postamble may be used as the tailing padding field.

Figure 4C:
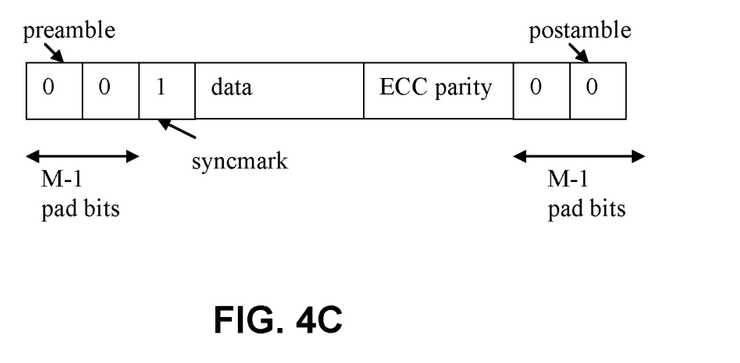

FIG. 4C illustrates a data frame structure according to one embodiment of the present invention. Assuming M=3 and the syncmark field has one bit, when the preamble happens to be all-zeros but shorter than M−1, the syncmark may be chosen as 1. Only enough 0s may be added so that the length of the padding field may be M−1 bits. As shown in FIG. 4C, the preamble is 0, but the preceding padding field needs two 0s. The preamble may be used as the first 0 in the preceding padding field, and a 0 may be added to make the preceding padding field two 0s. Similarly, a 0 may be added after the ECC parity to form the two 0 tailing padding field with the postamble, which is 0.

Figure 4D:
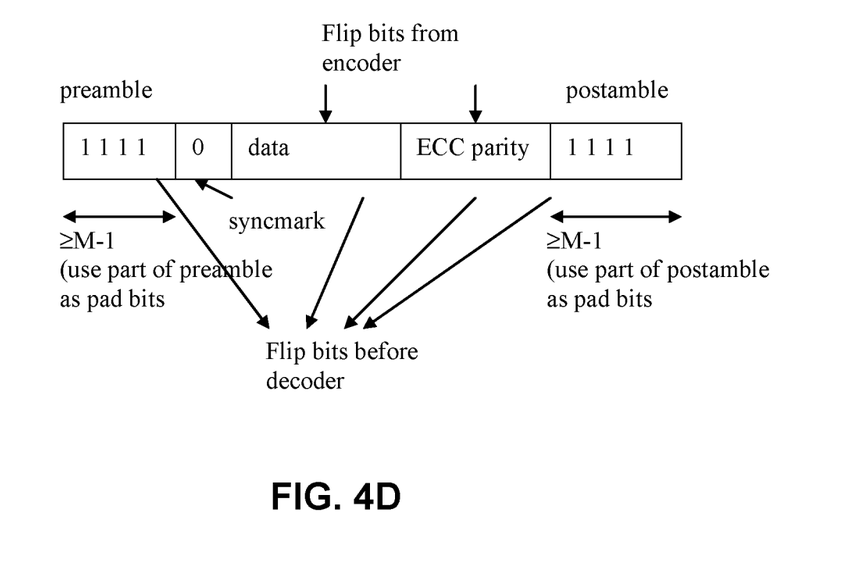

FIG. 4D illustrates a data frame structure according to one embodiment of the present invention. Assuming M=3 and the syncmark field has one bit, when the preamble and postamble happen to be all-ones and longer than or equal to M−1, the syncmark may be chosen as 0. The last M−1 1s in the preamble may be used as the preceding padding field, and the first M−1 1s in the postamble may be used as the tailing padding field. All bits need to be flipped after ECC encoding and before ECC decoding.

Figure 4E:
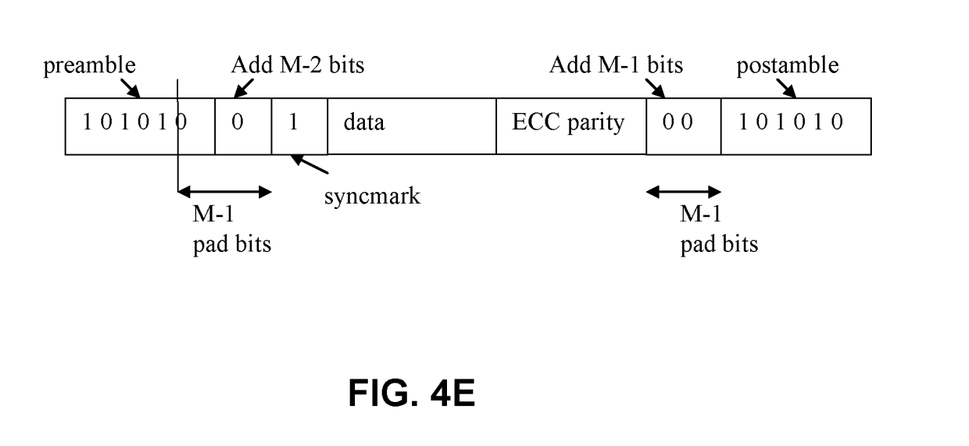

FIG. 4E illustrates a data frame structure according to one embodiment of the present invention. When the preamble and postamble are not all-zeros or all-ones, the preamble/postamble may be shared with pad bits as much as possible. Assuming the preamble and postamble are 101010 and M=3, the last 0 of the preamble may be used as one of the pad bits before syncmark, and M−1−1 bit (one 0 in this case) may be added before the syncmark. Since the postamble starts with 1 and cannot be used as pad bits, M−1 bits (two 0s in this case) may be added as the tailing padding field.

Figure 4F:
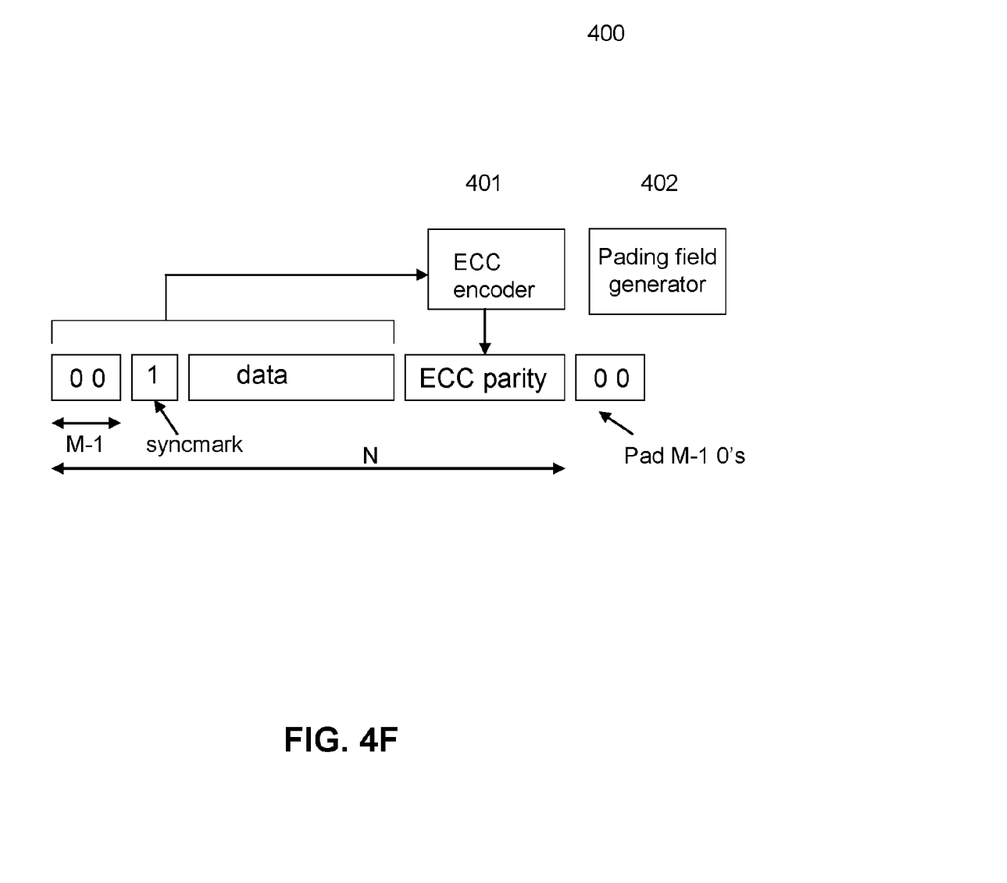
FIG. 4F illustrates a data frame structure and data processing in a transmitter according to one embodiment of the present invention.

FIG. 4F illustrates a data frame structure and data processing in a transmitter according to one embodiment of the present invention. The data frame may be similar to the one shown in FIG. 4C, and the data to be transmitted may have 16 bits, e.g., 1000, 1101, 1100, 0100.

In FIG. 4F, the transmitter may have a data frame generator 400, which may include an encoder 401 and a padding field generator 402. The padding field generator 402 may generate a preceding padding field and a tailing padding field for a data frame to be transmitted and add them to the data frame. In one embodiment, the padding field generator 402 may simply generate a padding field with M−1 bits of 0s. In one embodiment, the padding field generator 402 may decide whether it is possible to share pad bits with the preamble and/or postamble, and how many bits need to be added before the syncmark and/or after the ECC parity, as described above with reference to FIGS. 4A-4E.

In one embodiment, the encoder 401 may be an ECC encoder using a shortened Hamming code with a five bit parity, which has the following primitive generator polynomial:

$$g(x) = x^5 + x^2 + 1$$

Other coding methods may be used, as long as they can detect at which bit an error, if any, occurs and correct the error.

The ECC encoder 401 may consider the preceding padding field, the syncmark, and the data as input, which is: 00 1 1000 1101 1100 0100, and the original message vector u(x) is:

$$u(x) = x^{16} + x^{15} + x^{11} + x^{10} + x^8 + x^7 + x^6 + x^2$$

The correction length N of the ECC encoder 401 may be equal to:

$$N = M - S + \text{syncmark length} + \text{data length} + \text{parity length}$$
$$= 3 - 1 + 1 + 16 + 5$$
$$= 24$$

The parity may be the remainder of $x^5 u(x)$ divided by $g(x)$, and may be calculated as follows:

$$P = (x^5(x^{16} + x^{15} + x^{11} + x^{10} + x^8 + x^7 + x^6 + x^2)) \bmod (x^5 + x^2 + 1)$$
$$= x^4 + 1$$
$$= 10001$$

In one embodiment, the ECC encoder 401 may use a cyclic ECC. One unique property of the cyclic ECC is that if it is shifted to the left for L bits, with L bits of 0 added to its end, the result is still a codeword recognizable by a decoder. As described above, M−1 0s may be padded after the ECC parity by the padding field generator 402 before transmission, and the data frame to be transmitted may become:

| 00 | 1 | 1000, 1101, 1100, 0100 | 10001 | 00 |   (1)

Since the ECC encoder 401 is a cyclic ECC, if there is no error, all M possible shifts may still be valid codewords. As shown, these possible shifts may be:

1) | 00 | 1 | 1000, 1101, 1100, 0100 | 10001 | when there is no shift;

2) | 0 | 1 | 1000, 1101, 1100, 0100 | 10001 | 0 | when there is one bit shift to the left; and

3) | 1 | 1000, 1101, 1100, 0100 | 10001 | 00 | when there is a two bit shift to the left.

Thus, even if there is a bit shift during the data transmission and a receiver misses the left most one or two bits of the data frame, it may still reliably detect the syncmark and retrieve the transmitted data.

Figure 5:
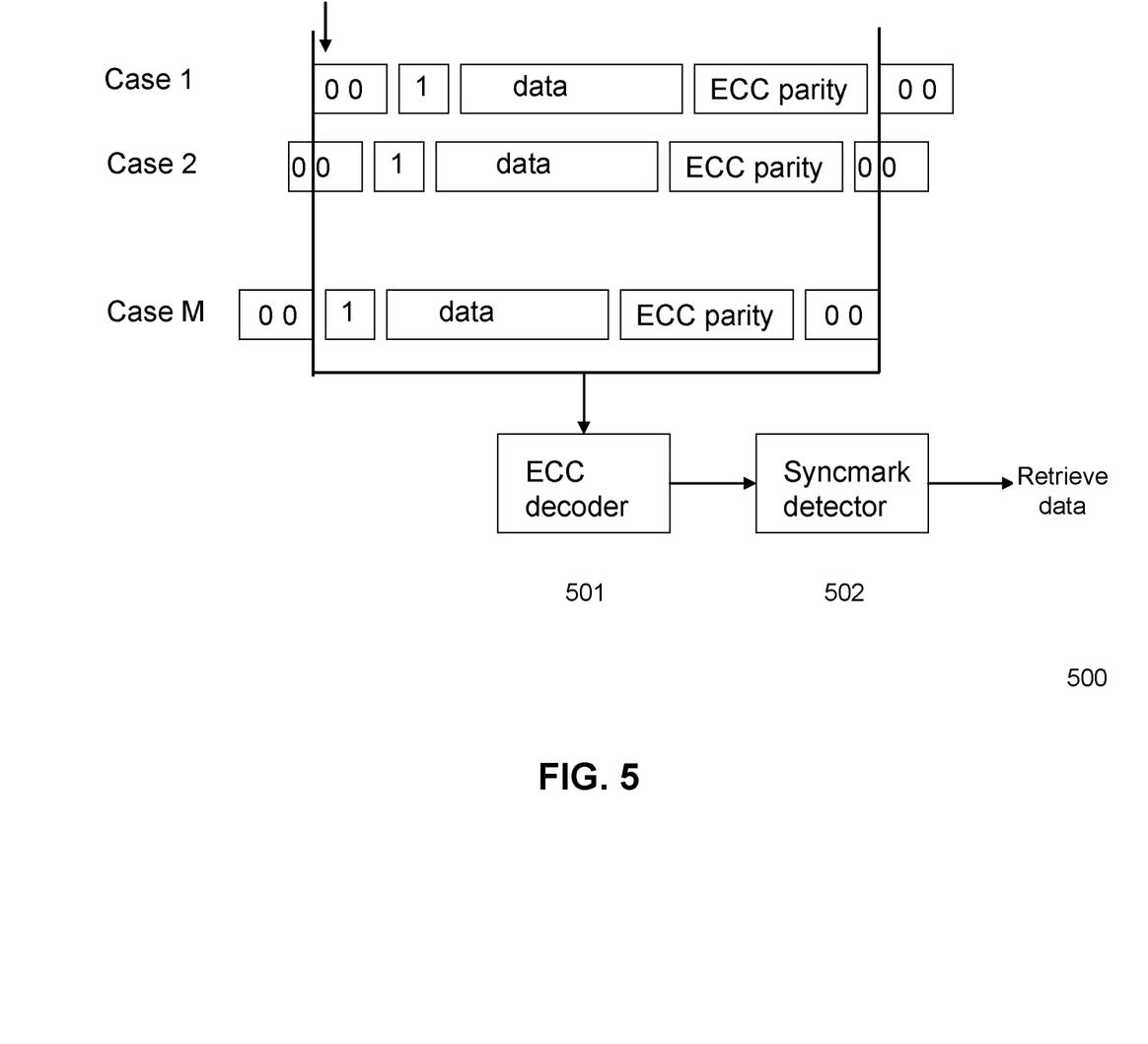
FIG. 5 illustrates data processing in a receiver according to one embodiment of the present invention.

FIG. 5 illustrates data processing in a receiver according to one embodiment of the present invention. Instead of searching for the syncmark first, the receiver shown in FIG. 5 may perform ECC decoding first to detect and correct errors and then search for the syncmark in the decoded data frame to retrieve the transmitted data. Since transmission errors, if any, may be detected and corrected before the search for the syncmark, the data transmitted may be located more reliably.

Specifically, a data start location detector 500 in a receiver may have a decoder 501 and a syncmark detector 502. The data frame may enter an ECC decoder 501 first. The ECC decoder 501 may take the first N bits, the same as the correction length of the encoder 401, as its input, and may receive $$1110, 0011, 0111, 0001, 0010, 0010 \quad (2)$$

Compared with the data transmitted (1), the received data has a one bit shift to the left and a transmission error at the left most bit.

The received codeword may be:

$$x^{23} + x^{22} + x^{21} + x^{17} + x^{16} + x^{14} + x^{13} + x^{12} + x^8 + x^5 + x^1$$

The ECC decoder 501 may compute the syndrome of the received codeword, which is the reminder of dividing the codeword by $g(x)$:

$$\text{snydrome} = (x^{23} + x^{22} + x^{21} + x^{17} + x^{16} + x^{14} + x^{13} + x^{12} + x^8 + x^5$$
$$+ x^1) \bmod (x^5 + x^2 + 1)$$
$$= x^3 + x^2 + x + 1$$

Since the syndrome is equal to the reminder of dividing $x^{23}$ by $g(x)$, the ECC decoder 501 may determine that there is an error at bit 23, the left most bit location, and then make the correction. Consequently, the output of the ECC decoder is 0110, 0011, 0111, 0001, 0010, 0010

Because of the use of the cyclic ECC, although there is a bit shift, the received codeword is still a valid codeword.

The syncmark detector 502 may then search the decoded and corrected data frame for the left-most 1 as the syncmark, which is the second left most bit. After that, the transmitted data, which is the 16 bits immediately after the syncmark, may be retrieved as:

1000, 1101, 1100, 0100

Thus, although the received data frame has a bit shift and a transmission error, the data start location detector 500 shown in FIG. 5 may correctly detect the data start location.

Figure 6:
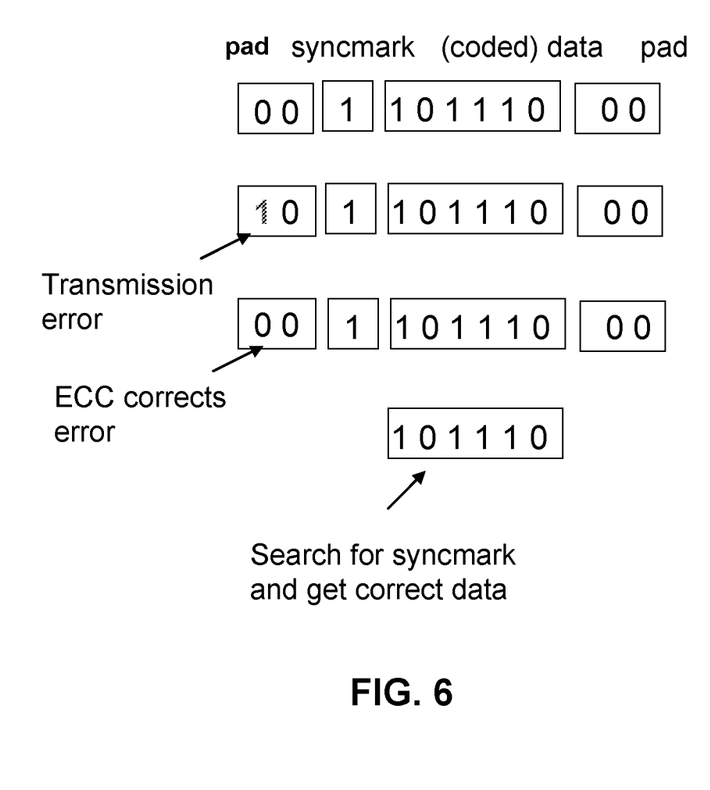
FIG. 6 illustrates a successful search for a data start location when there is a transmission error according to one embodiment of the present invention.

FIG. 6 illustrates a successful search for data start location according to one embodiment of the present invention. Similarly to the example shown in FIG. 3, a transmission error occurs in the pad in front of the syncmark, but the error may be corrected by the ECC decoder 501, and the data start location may be correctly detected in the decoded and corrected data frame by the syncmark detector 502.

Figure 7:
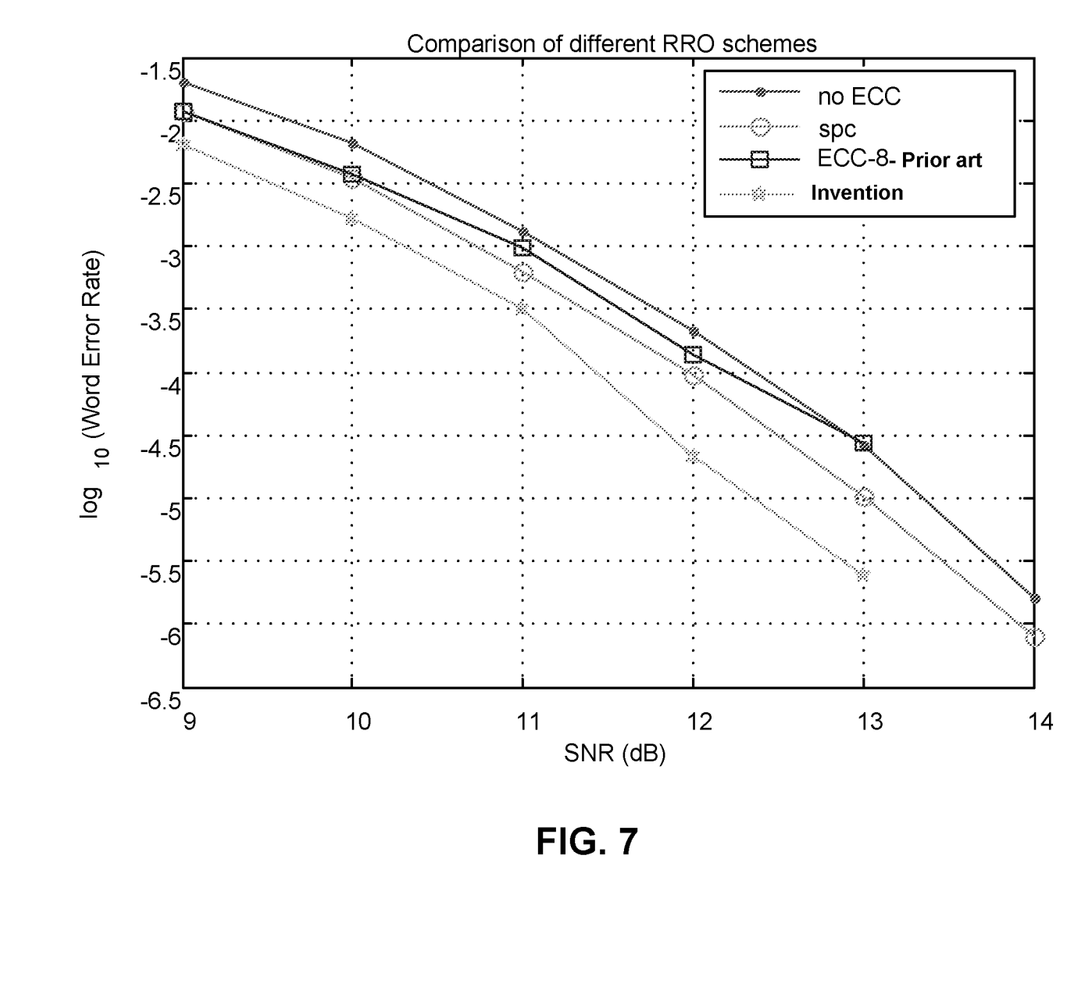
FIG. 7 illustrates a chart comparing error rates of a method for detecting data start location according to one embodiment of the present invention and a prior art method.

FIG. 7 illustrates a chart comparing error rates of a method for detecting data start location according to one embodiment of the present invention, a prior art method ECC-8, a prior art method using SPC (single-parity-check), and a prior art method without ECC. As shown, the method of the present invention may considerably lower the error rate.

Figure 8:
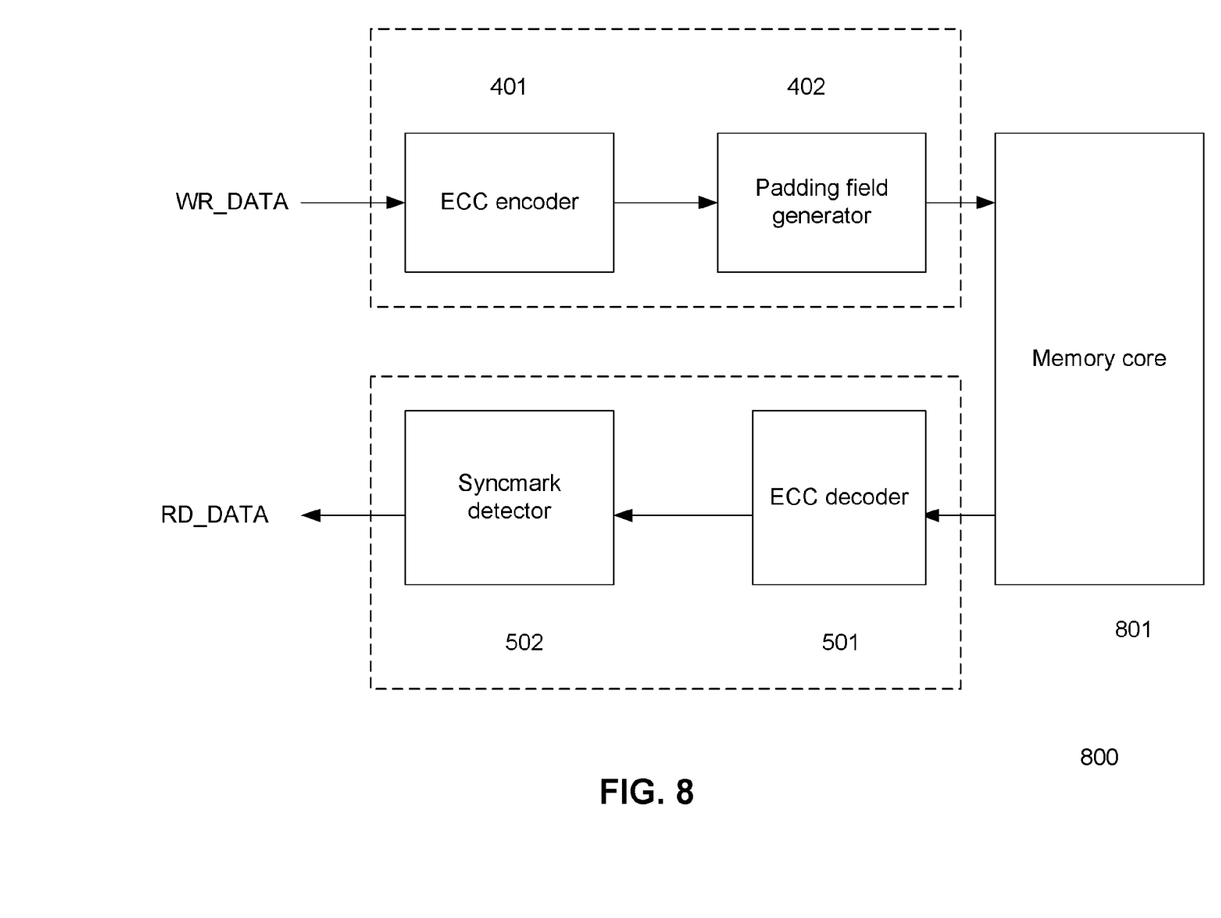
FIG. 8 illustrates a memory device using an apparatus for detecting data start location according to one embodiment of the present invention.

The data transmission method and apparatus of the present invention may be used in any data transmission devices, e.g., memory devices and telecommunication devices. FIG. 8 illustrates a memory device using an apparatus for detecting data start location according to one embodiment of the present invention. As shown, data written to a memory device 800 may enter the ECC encoder 401 for encoding and the padding field generator 402 for adding the padding field before being stored into a memory 801. During a read operation, the data from the memory 801 may enter the ECC decoder 501 first to have transmission errors, if any, detected and corrected. The decoded data may then enter the syncmark detector 502 to detect the data start location.

The data frame generator 400 and data start location detector 500 may be implemented by hardware, software or firmware or a combination of the above. The hardware may include a processor, e.g., a processor for controlling a memory device or a transmitting/receiving module in a telecommunication device. Software and/or firmware implementations would be carried out on such a processor.

Several features and aspects of the present invention have been illustrated and described in detail with reference to particular embodiments by way of example only, and not by way of limitation. Alternative implementations and various modifications to the disclosed embodiments are within the scope and contemplation of the present disclosure. Therefore, it is intended that the invention be considered as limited only by the scope of the appended claims.

What is claimed is:

1. A method for generating a data frame for data transmission, the method comprising using a processor to perform the following:
   generating a first padding field;
   generating one or more parity bits by encoding an input comprising the first padding field, a syncmark and data to be transmitted;
   adding the one or more parity bits to the data frame; and
   adding a second padding field after the one or more parity bits.
2. The method of claim 1, wherein the parity is generated with a Hamming code.
3. The method of claim 1, wherein the parity is generated using a cyclic ECC.
4. The method of claim 1, wherein the syncmark is 1.
5. The method of claim 4, wherein the first padding field comprises M−1 bit(s) of 0s.
6. The method of claim 1, wherein the first padding field shares bits with a preamble of the data frame.
7. An apparatus for generating a data frame for data transmission, the apparatus comprising:
   a padding field generator, for generating a first padding field; and
   an encoder, for generating one or more parity bits by encoding an input comprising the first padding field, a syncmark and data to be transmitted; and adding the one or more parity bits to the data frame,
   wherein the padding field generator further determines whether to share bits in the first adding field with a pramble of the data frame.
8. The apparatus of claim 7, wherein the encoder uses a Hamming code.
9. The apparatus of claim 7, wherein the encoder is a cyclic ECC.
10. The apparatus of claim 7, wherein the padding field has M−1 bit(s), M is the possible number of data start locations in the data frame.

\* \* \* \* \*